United States Patent [19]
Murata et al.

[11] Patent Number: 5,777,567
[45] Date of Patent: Jul. 7, 1998

[54] SYSTEM AND METHOD FOR SERIAL TO PARALLEL DATA CONVERSION USING DELAY LINE

[75] Inventors: David M. Murata; Robert J. Bosnyak, both of San Jose; Robert J. Drost, Palo Alto, all of Calif.

[73] Assignee: Sun Microsystems, Inc., Mountain View, Calif.

[21] Appl. No.: 663,583

[22] Filed: Jun. 14, 1996

[51] Int. Cl.$^6$ ........................................................... H03M 9/00
[52] U.S. Cl. ........................................................... 341/100
[58] Field of Search ............................. 341/100, 95, 101

[56] References Cited

U.S. PATENT DOCUMENTS

5,164,724   11/1992   Hartley ............................. 341/95

Primary Examiner—Brian K. Young
Attorney, Agent, or Firm—Robert Scott Hauser

[57] ABSTRACT

A serial data to parallel data converter is disclosed which has the advantage of accurately converting high frequency serial data to parallel data while using clock signals operating at a relatively low frequency. A low bit error rate is achieved by avoiding the use of multiple high speed clock lines typically found in other converters. The simplified circuit design also has the advantage of requiring minimal semiconductor layout area and reduced power requirements. One embodiment includes a buffer, a first data delay line, coupled to receive serial data from the buffer, and a phase lock loop (PLL), coupled to receive serial data from the buffer. A second data delay line is configured as a voltage controlled oscillator (VCO) within the PLL. The PLL locks onto the incoming serial data signal and provides a control signal back to the first data delay line to ensure it is storing serial data bits as they arrive. After n-bits of data have been transmitted the first data delay line contains a n-bit wide parallel word.

25 Claims, 10 Drawing Sheets

SYSTEM AND METHOD FOR SERIAL TO PARALLEL DATA CONVERSION USING DELAY LINE

BACKGROUND OF THE INVENTION

1. Field of the Invention

The present invention relates to data communications systems. In particular, this invention relates to a serial to parallel data converter for use as an interface circuit between a serial communication link and a parallel data path.

2. Description of the Related Art

As computer technology continues to evolve, sharing information is increasingly important to all types of data processing systems. One way to share information is to use a communication link between a first point and a second point. Currently, communication links are used to link points on individual chips, to link multiple chips, to link two or more circuit boards, and to link computer systems. In general, communication links can be classified as either parallel or serial. A parallel communication link includes n-conductor elements or 2n differential conductor elements. To expedite data processing, the number of conductors (n) in a parallel bus is typically selected to match the width of the data transferred in a hardware system. For example, a 16-bit computer (i.e. one which uses 16-bit data words) may use a 16-bit wide parallel communication bus to transfer data. In contrast, a serial communication link typically includes only one conductor element or a differential pair of conductor elements regardless of the data word size implemented in the hardware.

A serial link typically has lower implementation costs than the parallel bus because only one differential pair of conductors is required to complete a connection between the two end points of the communication link. However, fewer conductor elements in the serial link also reduces the overall bandwidth (i.e. the amount of data transferred during a given time interval or cycle). In contrast, a parallel communication link or bus, with n-conductors may carry up to n-bits of data during a single time interval T and therefore has a bandwidth of n-bits/T. The value of T is equal to 1/frequency. Therefore, a 16-bit wide parallel bus running at a frequency of 10 Mhz has a T=100 ns and consequently transmits 16 bits of data every 100 ns to yield a bandwidth of 160 Mbits/sec. In contrast, a serial link running at a frequency of 10 Mhz typically has a bandwidth of 10 Mbits/sec. because, during the same 100 ns time interval, each data bit must be transmitted sequentially over the single conductor.

Despite these shortcomings, the serial link remains an attractive solution because of its simplicity. With only one set of conductor elements and therefore minimal circuitry, the serial link can be used to interconnect a wide range of computer systems and peripheral components. These various systems can be coupled together with a serial link even though they may have varying internal bus widths. For example, a serial communication link enables an 8-bit computer with an 8-bit wide data bus to communicate with a 16-bit computer with a 16-bit wide data bus by converting the parallel data from each computer into a standard serial data stream format understood by both machines. Serial communication links are also desirable because pre-existing wiring, such as telephone lines, can be used to carry the serial data.

A serial to parallel converter allows modern computer systems to take advantage of features in both parallel and serial communication links. Both serial and parallel communication links can share information using a serial to parallel converter to convert the information. The serial-to-parallel converter usually converts the serial bits into a parallel data word after the parallel data words are transmitted over the serial link. Unfortunately, this conversion process may occupy a significant period of time and further increase the serial link's overall latency.

Converting serial data into parallel words for newer machines having a word size of 64 bits or greater is particularly time consuming. Wider word sizes require increased processing time because additional serial bits must be received and converted into a much wider parallel data word. In these newer machines, serial link latency is degraded, causing a performance hit, because converting 64 bits of serial data into a 64-bit parallel word can often take up to twice as long as it would to convert 32-bits of serial data into a 32-bit parallel word. This performance hit is often not acceptable in high speed machines which require lower latency communication links for use in multimedia, online systems and other network based applications. Consequently, conventional serial to parallel converters have difficulty accommodating the wider words and lower latency requirements typically found in state of the art machines.

Hewlett-Packard's G-link chip set is one product that provides relatively high speed conversion of serial to parallel data and vice versa. The G-link chipset is described in "The HP 2-Gbaud G-Link Chipset", C. Yen et al., Hewlett-Packard Company. The G-link chip set includes a receiver chip capable of converting serial data into 16 or 20 bit wide parallel data and a transmitter chip capable of converting 16 or 20 bit wide parallel data into a serial data stream. Both chips are fabricated using a bipolar process to obtain the 2 GBaud speed. While the G-link chipset solution does provide a relatively fast serial to parallel solution, it is expensive to implement because two chips are required. Furthermore, bipolar transistors typically consume a great deal of power.

In addition, the Hewlett-Packard G-link chip set employs a conventional parallel-to-serial data conversion technique in which the operating frequency of a phase lock loop (PLL) matches the serial data transmission frequency. This is particularly undesirable at high frequencies. A high speed PLL, which operates at the transmitter frequency, tends to introduce noise into the silicon substrate and interfere with other on-chip circuitry due to capacitive coupling. Moreover, the interference and noise becomes additive when multiple devices are placed on a single chip. Consequently, the increased interference and high on-chip noise levels make it difficult for the Hewlett-Packard converter chip to accept and convert multiple serial channels on the same chip.

Another serial link has been provided by the Serial Link Technology Group from Bull of France. The Bull device is disclosed in the paper, "Integration of Multiple Bidirectional Point-to-Point Serial Links in the Gigabits per Second Range", by Roland Marbot et al., (BULL Serial Link Technology, Hot Interconnects Symposium, 1993, France). The Bull device employs a frequency multiplier for parallel to serial data conversion. Unfortunately, like the G-link chipset discussed above, the Bull device typically introduces noise into the silicon substrate and interferes with other multipliers on the chip. In addition, the Bull technology uses an exclusive OR (XOR) tree for parallel to serial conversion which makes equalizing the delay paths through the device difficult. The delay equalization problems of the Bull device typically occur because various data paths through the XOR tree may take longer to complete than others. Bull attempts to equalize the delay using a delayed phase lock loop circuit in conjunction with a special coding scheme. This technique addresses delay equalization in XOR trees but often results in reduced coding efficiency.

Yet another proposed serial link is described in U.S. patent application Ser. No. 08/254,326 entitled "HIGH SPEED SERIAL LINK FOR FULLY DUPLEXED DATA COMMUNICATION", filed by Deog-Kyoon Jeong on Jun. 6, 1994 and assigned to the assignee of the present invention, (hereinafter the Jeong application). The Jeong application discloses a point-to-point serial communication link capable of converting data from parallel to serial and vice-versa at speeds greater than one gigabit per second. On the receiving end, Jeong uses a 100 MHz, thirty phase clock to recover 10-bit words from the serial data stream. Each bit in the 10 bit word has three clock lines associated therewith. As each data bit arrives at the receiver, a sense amplifier controlled by the three clocks respectively samples each bit. The three samples for each bit are then weighted ("voted" upon) and statistically used to determine the bit value. In certain circumstances, the multiple clocks of the Jeong device may be difficult to synchronize and result in increased bit-error rates. Multiple clocks may also occupy a large area on the semiconductor die and are therefore expensive to implement.

What is needed is a serial to parallel converter capable of converting high speed serial data into a parallel word using a low speed clock signal.

SUMMARY OF THE INVENTION

According to principles of the invention, a high speed serial to parallel converter circuit and method is presented. The circuit and method of the invention can be used for converting N bits of serial data transmitted over a data transmission medium into an N bit parallel data. One embodiment of the invention includes a buffer coupled to the data transmission medium for providing data signals, a phase lock loop (PLL) coupled to the buffer to generate a delay line control signal (Vcontrol) and a first data delay line, coupled to the buffer and the Vcontrol signal. The first data delay line generates n bit parallel data by cascading the serial data through the first delay line.

In one embodiment of the invention, the PLL includes a phase detector circuit, a charge pump circuit and a second data delay line. In this embodiment, the phase detector circuit is coupled to receive a data signal from the buffer circuit and a reference signal from the second data delay line. The phase detector generates a control signal having a magnitude corresponding to the signal characteristic differences of the data signal and the reference signal. In one embodiment, the charge pump circuit is coupled to the phase detector circuit and configured to produce the delay line control signal (Vcontrol) in response to the magnitude of the control signal. The second data delay line is coupled to receive the delay control signal (Vcontrol) and lock onto the rate at which the serial data is received in the buffer.

Another embodiment of the invention provides a framing circuit capable of generating a logical frame of data. In this embodiment the framing circuit includes a clock circuit capable of generating a latch signal when N parallel data elements have been received in the first data delay line. A storage circuit is coupled to store two or more physical frames of data located in the first data delay line upon receipt of one or more latch signals. The physical frame of data is then compared by a compare circuit which compares the physical parallel data with a plurality of predetermined bit patterns and indicates a pattern match when it is found. Next, a selector circuit selects a logical frame of data elements from the storage element based upon the pattern match and the offset indicated in the compare circuit. In this embodiment, the selector circuit will typically select the logical frame of data elements upon receipt of the latch signal.

The present invention uses a low-speed clock to latch each data byte, not each data bit, into the data storage element. Since the majority of the circuitry of the present invention does not operate at high clock rates, a low power CMOS circuit can be used to implement the serial link. The circuitry and method of the present invention is particularly advantageous because it can be implemented in standard CMOS technology. CMOS technology is cheaper, faster and more energy efficient than bipolar technology. Furthermore, using CMOS reduces overall costs because the serial link may be fabricated in the same die along with other CMOS designed circuitry.

The circuitry and method of the invention also has reduced bit error rates. Bit errors are minimized with the invention because the PLL precisely tracks the incoming data signal and accurately selects a logical frame of data from a parallel data word. Closely matched circuitry in the PLL and the first data delay line enables accurate tracking and latching of data with a single delay line ($V_{control}$) control line. These features of the invention minimize the need for oversampling logic circuitry, reduce semiconductor layout space requirements and reduce overall power consumption.

The present invention also reduces metastability without the oversampling and frequency estimation techniques required by other designs. Metastability occurs when data is read in a storage element before settling and hold times are met. The present invention effectively eliminates metastability problems by providing proper setup and hold times before the data is latched in the storage elements.

DESCRIPTION OF THE DRAWINGS

The objects, features and advantages of the circuitry and method of the present invention will be apparent from the following description in which.

DETAILED DESCRIPTION

Figure 1:
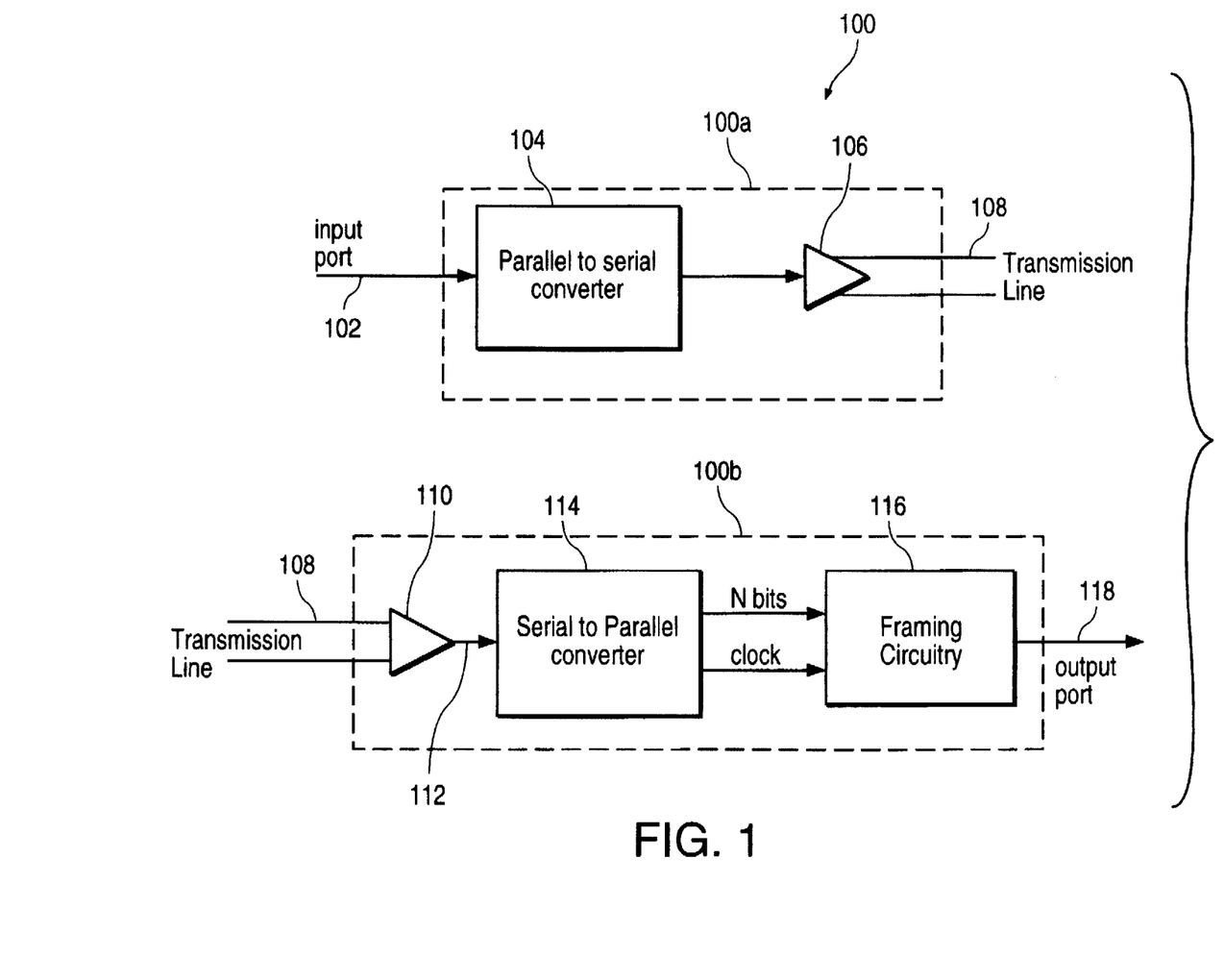
FIG. 1 is a block diagram of a serial link communication system which includes one embodiment of the invention.

FIG. 1 is a block diagram of a serial communication link system 100. System 100 includes a transmitter section 100a and a receiver section 100b. Transmitter section 100a and receiver section 100b are typically fabricated together on a single integrated circuit. System 100 may be used for point to point communication between two devices located at remote locations.

Transmitter section 100a includes a parallel to serial converter 104, a first driver circuit 106 coupled to parallel to serial converter 104 and a transmission line 108 coupled to the first driver circuit 106. Receiver section 100b includes transmission line 108, a second driver circuit 110 coupled to the transmission line 108, and a serial to parallel converter 114 coupled to second driver circuit 110. In one embodiment, receiver 100b also contains a framing circuit 116. Framing circuit 116 receives a clock signal and physical frame of data bits from serial to parallel converter 114 and generates a logical frame of data over an output port 118.

The width of the logical frame of data is typically related to the word size used by the machine. For example, an 8 bit machine would most likely use 8 bit wide words. In alternative embodiments, wider word sizes may be used to accommodate error detection and/or correction bits as required to generate DC balanced data. Generating DC balanced data typically requires increasing the bus width and encoding the resulting data words so that data bits are symmetrically distributed and errors are more easily detected. For example, an 8-bit machine may transmit a 10-bit wide data word in which the extra two bits may be used for either error detection and correction or DC balancing. Additional information describing error correction and detection, as well as DC balancing, can be found in *Information, Transmission, Modulation and Noise* by Mischa Schwartz published by McGraw Hill, 1980 pg. 176–202 and is incorporated herein in its entirety by reference.

One embodiment of the present invention is implemented using differential circuitry. One differential circuit design, as shown in FIG. 1, utilizes differential circuitry in first driver circuit 106 and second driver circuit 110 as well as over transmission line 108. In an alternative embodiment, a single ended circuit design, one that does not use differential circuitry (not shown) is used to implement the Applicant's invention. In either case, numerous alternative differential and single ended circuit designs have been contemplated by the Applicant and thus any examples provided herein should not be construed as limiting the invention.

The differential circuitry of the invention typically includes one line carrying the original signal and a second line carrying the inverse of the original signal. In one embodiment, the serial data carried over transmission line 108 is line encoded using a nonreturn to zero scheme (NRZ). In alternative embodiments, differential encoding schemes are used to code the data, including AMI, B6ZS, HDB3 or 4B3T. Together, the differential circuitry and encoding schemes reduce bit errors which may arise from voltage spikes, layout inconsistencies or any other problems that occur during data transmission.

In transmitting data, transmitter section 100a receives and processes data from parallel input port 102 for transmission over transmission line 108. Generally, parallel input port 102 receives data from a number of sources including, for example, a workstation, a personal computer, a high definition television, a local area network, a printed circuit board, or a chip containing serial link communication system 100. The parallel input port 102 may be coupled to any apparatus which provides data in parallel over a series of lines or a "bus". Once data is provided at input port 102, it is supplied to a parallel-to-serial converter 104. Converter 104 converts the parallel bit stream from input port 102 into an encoded serial bit stream and supplies it to first driver circuit 106 which is capable of driving signals over transmission line 108. First driver circuit 106 performs one or more line conditioning functions required for transmission. In particular, first driver circuit 106 is used to adjust the voltage level of the data from an on-chip level to a voltage level required for transmission. This data is then sent to a remote chip, PC board, system, or other apparatus configured to receive serial data. Transmission line 108 typically is a twinax or twisted pair and typically functions as a point-to-point link.

In receiving serial data, receiver 100b receives an encoded serial bit stream from transmission line 108. The incoming data received from transmission line 108 is then provided to second driver circuit 110. Second driver circuit 110 performs line conditioning functions on the encoded serial data. For example, second driver circuit 110 may be used to step up the voltage level from a transmission level to a level required for proper on-chip data processing operations. Serial to parallel converter 114 accepts the serial data supplied on serial lines 112, digitally samples it, and converts the data to a physical frame of data consisting of parallel data bits. If applicable, serial-to-parallel converter 114 applies error detection and correction or DC balance decoding techniques to the data. The physical frame of data is generally processed with additional framing circuitry 116. Framing circuitry receives the physical frame of data from converter 114 and generates a logical frame of data which typically represents one or more bytes of data. The logical frame of data provided over output port 118 may then be then connected to an external computer system, a bus on the chip, an on-chip device or any other apparatus capable of utilizing a logical frame of parallel data.

Serial-to-parallel converter device 114 and framing circuit 116, as described above, only illustrates one embodiment of the invention. Many other uses of the invention are contemplated and therefore this particular embodiment should not be considered limiting. For more information on the operation of a serial communication link similar to the system 100 see the above referenced Jeong application, incorporated herein, in its entirety, by reference.

Figure 2:
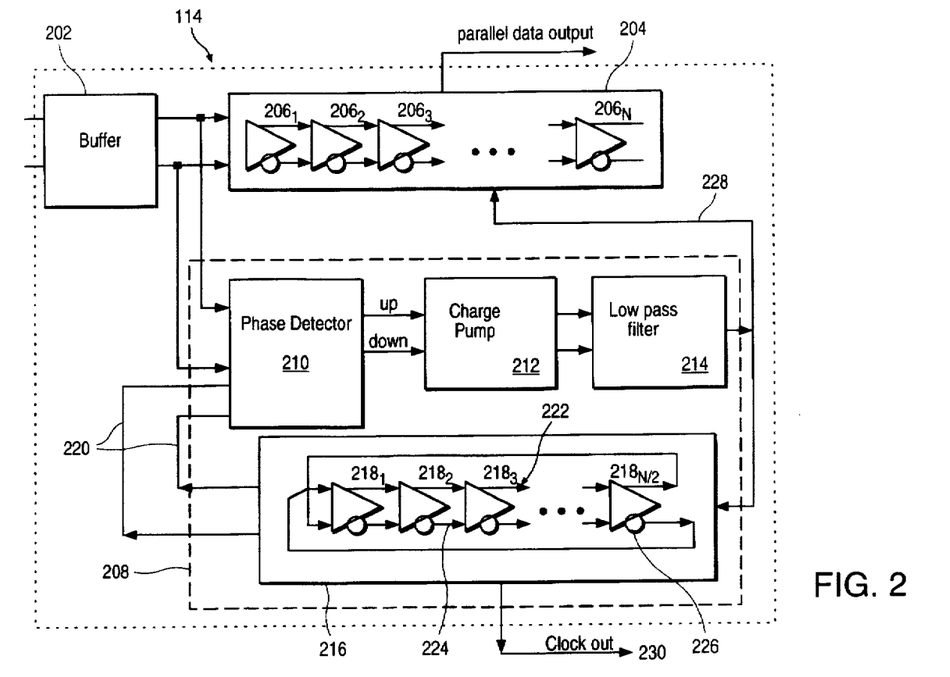
FIG. 2 is a block diagram of a serial to parallel converter according to the invention.

FIG. 2 is a block diagram of serial to parallel converter 114. Serial-to-parallel converter 114 includes a buffer 202, a first data delay line 204 including (N) delay elements $206_1$–$206_N$ coupled to buffer 202, and a phase-lock loop (PLL) 208 coupled to buffer 202 as shown. PLL 208 includes a phase detector 210 (for example a Hogge type phase detector), a charge pump 212, a low-pass filter (LPF) 214, and a voltage controlled oscillator (VCO) 216 configured from a second data delay line 222 having N/2 delay elements $218_1$–$218_{N/2}$.

Buffer 202 is coupled to receive the serial data signals from second driver circuit 110. Buffer 202 conditions the data for further signal processing. Buffer 202 is used to provide protection from external signals and to level shift the signals before they reach delay elements $206_1$ through $206_N$ in first data delay line 204. Each delay element $206_1$ through $206_N$ temporally stores each received serial data bit before propagating the bit to the next delay element. In this manner, data bits received by first data delay line 204 "cascade" through delay elements $206_1$ through $206_N$ respectively.

Voltage controlled oscillator (VCO) 216 is used to generate a reference signal lines 220. Two reference signal lines 220 are shown in FIG. 2 because, as described in detail above, one embodiment of the invention utilizes differential circuitry. VCO 216 is a ring oscillator constructed from delay elements $218_1$–$218_{N/2}$. In one embodiment, there are half as many dual ported delay elements in VCO 216 as in first data delay element 204. The first ports of each delay element $218_1$–$218_{N/2}$ are daisy chained together to form a first data path 222. The second ports of each delay element $218_1$–$218_{N/2}$ are also daisy chained together as shown to form a second data path 224. The output of first data path 222 from the last delay element $218_{N/2}$ is cross coupled to second data path 224 input at the first delay element 218. Similarly, the output of second data path 224 from the last delay element $218_{N/2}$ is cross coupled to first data 222 path input at the first delay element. In one embodiment, first delay path 222 is non-inverting and second delay path 224 is inverting. The inversion is introduced into second delay path 224 by utilizing an odd number of inverter elements 226 along second data path 224. As a result, the signals carried over reference signal lines 220 transition each time the signal in VCO 216 propagates twice through the delay elements of VCO 216.

Delay elements $218_1$–$218_{N/2}$ used in VCO 216 have substantially identical delay characteristics as delay elements $206_1$–$206_N$ in first data delay line 204. This novel feature enables the VCO 216 to track the rate data is stored in first data delay line 204. Specifically, each signal transition over reference signal line 220 indicates the time period it takes for N bits of data to be stored in first data delay line 204. VCO 216 also provides a clock line 230 which provides a transition signal each time first data delay line 204 receives N data bits. Clock line 230 is used by framing circuit 116 which is described in more detail below.

The serial data signal provided to first data delay line 204 is also provided to phase detector 210 of PLL 208. Phase detector 210 is coupled to receive the serial data signal and reference signal lines 220 generated by voltage controlled oscillator (VCO) 216. Phase detector 210 compares the phase of a bit position edge of the incoming serial data from buffer 202 with a transition edge from reference signal lines 220 produced by VCO 216. The result of the comparison results in two possible courses of action:

(i) if the phase of a bit position edge in the incoming serial data is "ahead" of the clock transitions over reference signal lines 220, then phase detector 210 activates the "up" signal. As a result, the voltage output of charge pump 212 is increased so that the phase and frequency over the reference signal lines 220 from VCO 216 matches the rate of the incoming serial data;

(ii) if the phase of a bit position edge in the incoming serial data is "behind" the clock transitions over reference signal lines 220, then phase detector 210 activates the "down" signal. As a result, the voltage output of charge pump 212 is decreased so that the phase and frequency of the reference signal over reference signal lines 220 from VCO 216 matches the rate of the incoming serial data.

The "up/down" output signals generated by phase detector 210 may also include undesirable high frequency components. These undesirable high frequency components are created when the serial input signal and reference signal lines 220 are processed by phase detector 210 and; amplified by charge pump 212. To resolve this, low pass filter 214 filters out the undesirable high frequencies from the output signals of phase detector 210, after the output signals pass through charge pump 212, by shunting them to ground. Filtering these unwanted frequencies helps PLL 208 lock onto the phase and frequency of the incoming serial data signal.

PLL 208 also uses the signal from reference signal lines 220 and the serial data signal to generate delay control line 228 (Vcontrol). The propagation delay of delay elements $206_1$–$206_N$ and delay elements $228_1$–$228_{N/2}$ are adjusted with delay control (Vcontrol) line 228 such that the propagation delay of each delay element corresponds to the bit period of the incoming serial data. Vcontrol line 228 biases circuitry of each delay element in real time, using voltage or current control techniques, to accommodate fluctuations in the incoming serial data signal rate. Because the delay elements in VCO 216 and first data delay line 204 have matching delay periods, the signal on Vcontrol line 228 can be used to adjust both the frequency of VCO 216 and the rate data propagates through first data delay line 204. In particular, Vcontrol line 228 signal adjusts the output frequency of VCO 220 to match the frequency of the incoming serial data. The signal at Vcontrol line 228 is also is used to adjust the propagation delay of each element in first delay line 204 so that incoming serial data bits cascade through first data delay line 204. Thus, once PLL 208 enters lock, data bits are temporally stored in first data delay line 204 even when the serial data input frequency fluctuates.

Serial to parallel converter 114 makes a physical data frame available in first data delay line 204. Serial to parallel converter 114 forms a physical frame of parallel data bits by cascading serial data bits into first data delay line 204. In some cases, the physical frame of data provided by serial to parallel converter 114 can be used immediately. However, most computer systems, or data processing devices, require a physical frame to be converted into a logical frame of data. A logical frame of data typically includes bytes or words which can be used by a processor in a computer system or other data processing devices. Unfortunately, the logical frame of data is typically split between one or more physical frames of data. To this end, framing circuit 116 is provided to process one or more physical frames of data and produce the required logical data frames.

Figure 3:
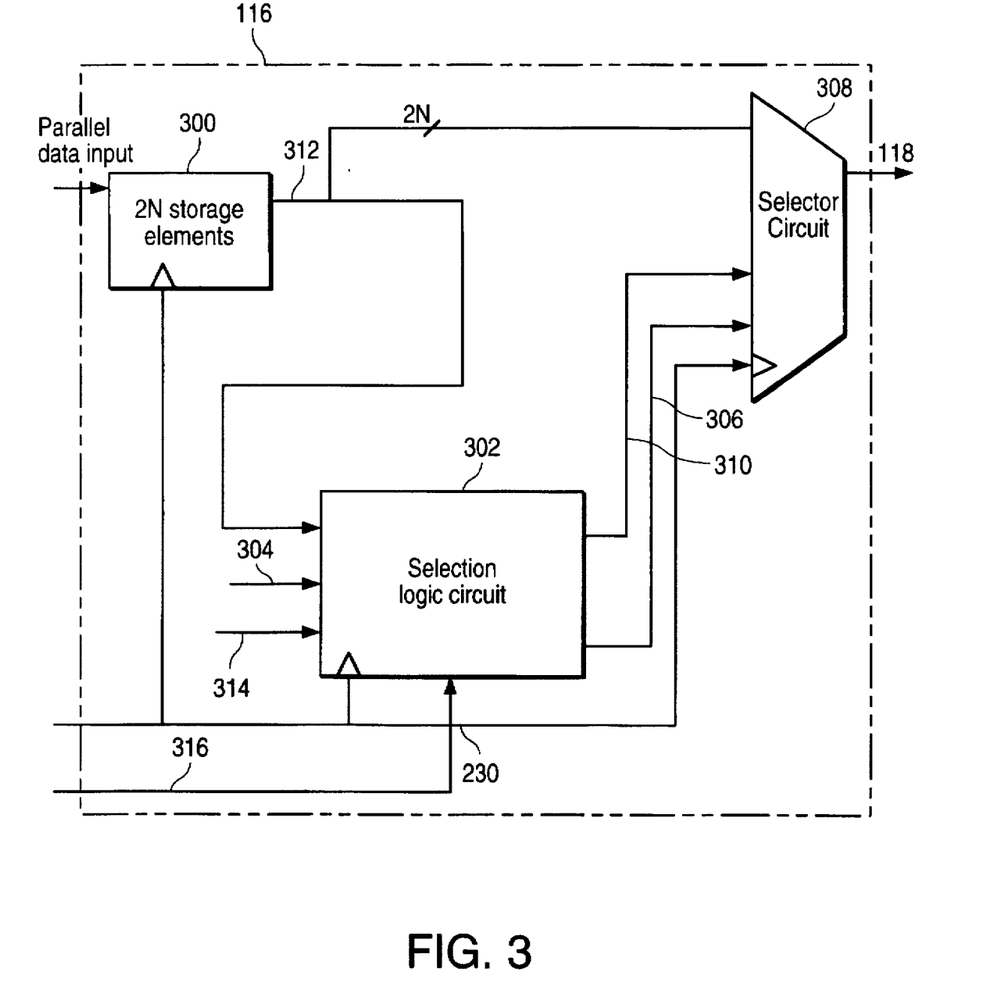
FIG. 3 is a block diagram of a framing circuit used to generate a logical frame of parallel data from an N-bit wide physical frame of parallel data.

FIG. 3 illustrates a block diagram of framing circuit 116. In one embodiment, a logical frame of data is selected by framing circuit 116 from a particular offset within the physical data frame contained in the first data delay line 204. Framing circuit 116 utilizes a reserved bit pattern, called a preamble, to determine where the offset of a logical data frame is located within the physical data frame. Thereafter, each logical frame of data is located at the same offset in one or more subsequently transmitted physical frames of data.

Framing circuit 116 includes a storage element 300 capable of storing at least 2N data elements, a selection logic circuit 302 coupled to storage element 300 and a selector circuit 308 coupled to both selection logic circuit 302 and storage element 300 as shown. Storage element 300, selection logic circuit 302, and selector circuit 308 operate upon receipt of a clock signal provided by clock line 230. Initially, N bits of serial data are received and processed by serial to parallel converter circuit 114. The resulting physical frame of parallel data is temporally stored in first data delay line 204. Storage element 300 is coupled to receive N bits of data from first data delay line 204 upon receipt of a clock signal over clock line 230. In one embodiment, VCO 216 generates a clock signal over clock line 230 when N bits of data have been stored and settled in first data delay line 204. After receiving two clock signals, storage element 300 contains a sequence of 2N data bits. In one embodiment, storage element 300 is constructed using two N-bit shift registers. A first N-bit register is loaded from delay line 204 on each clock signal over clock line 230. The parallel output of the first N-bit register is provided as input to a second N-bit register upon a subsequent clock signal over clock line 230.

Selection logic circuit 302 is coupled to receive the 2N data bits from storage element 300 over a data input line 312 and a preamble bit pattern over a preamble input line 304. Initially, a reset signal over a reset line 316 causes selection logic circuit 302 to reset comparison logic within selection logic circuit 302. Resetting the comparison logic in selection logic circuit 302 generates a mask signal over mask line 310 which causes the selector circuit 118 to gate "off" data over output port 118. Output port 118 remains gated "off" until the location of logical frame of data is located by selection logic 302. Typically, selection logic circuit 302 determines the logical frame offset location by making one or more comparisons with the 2N data bits and the preamble bit pattern provided over preamble input line 304. Selection logic circuit 302 determines the offset location of a logical frame of N bits within the 2N data bits and generates an address corresponding to this offset location over an address line 306. Selector circuit 308, is coupled to receive the 2N data bits from storage element 300 and select a logical frame of N data bits based upon the address received over address line 306. Once a logical frame of data is detected, selection logic circuit 302 generates a mask signal over mask line 310 which causes the selector circuit 308 to gate "on" output port 118. Upon receipt of a clock signal, selector 308 generates a logical frame of N parallel data bits for output over output port 118.

Figure 4:
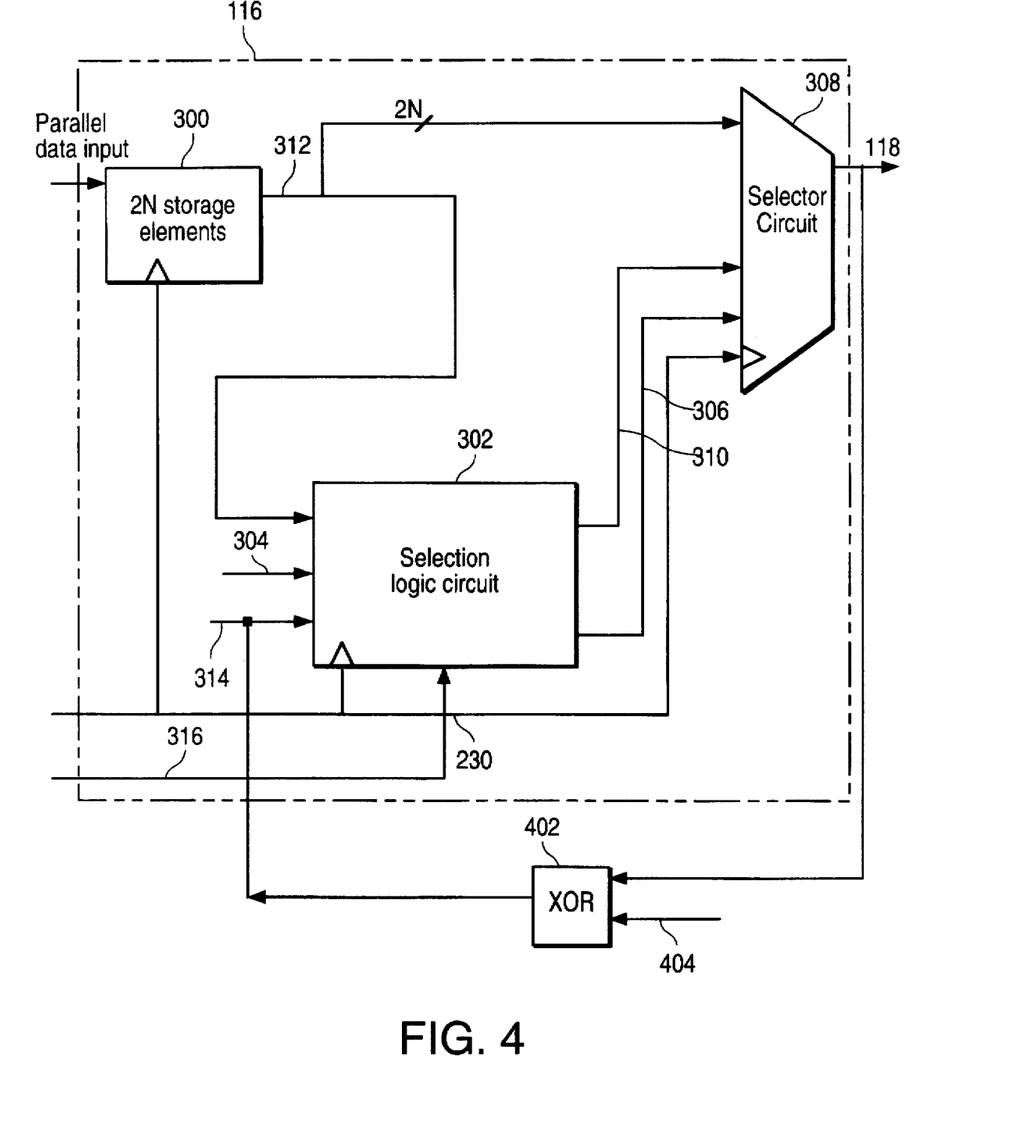
FIG. 4 is another embodiment of the framing circuit coupled to receive a resync signal for resynchronization the framing circuitry.

In another embodiment of framing circuit 116, illustrated in FIG. 4, selection logic circuit 302 is coupled to resync circuitry which generates a resync signal over a resync input line 314. The resync circuitry causes the framing circuit to reset when a particular postamble bit pattern is transmitted over the serial link. A postamble bit pattern is a reserved bit pattern transmitted over the serial link which marks the end of data transmission. The resync circuitry includes an XOR gate 402 coupled to receive a postamble bit pattern over a postamble input line 404 and a logical frame of data from output port 118. In one embodiment, a postamble bit pattern is received over output port 118. XOR gate 402 receives the postamble bit pattern and compares it with the predetermined postamble bit pattern provided over postamble input line 404. Resync line 314 receives a resync signal when XOR gate 402 determines the data received from output port 118 matches the predetermined postamble bit pattern provided over postamble input line 404. The comparison logic in selection logic circuit 302 receives the resync signal and generates a mask signal over mask line 310 which causes the selector circuit 118 to gate "off" data over output port 118. Consequently, framing circuit 116 stops producing logical data frames over the output port 118 until the location of a subsequent logical frame of data is located by selection logic circuit 302.

Figure 5:
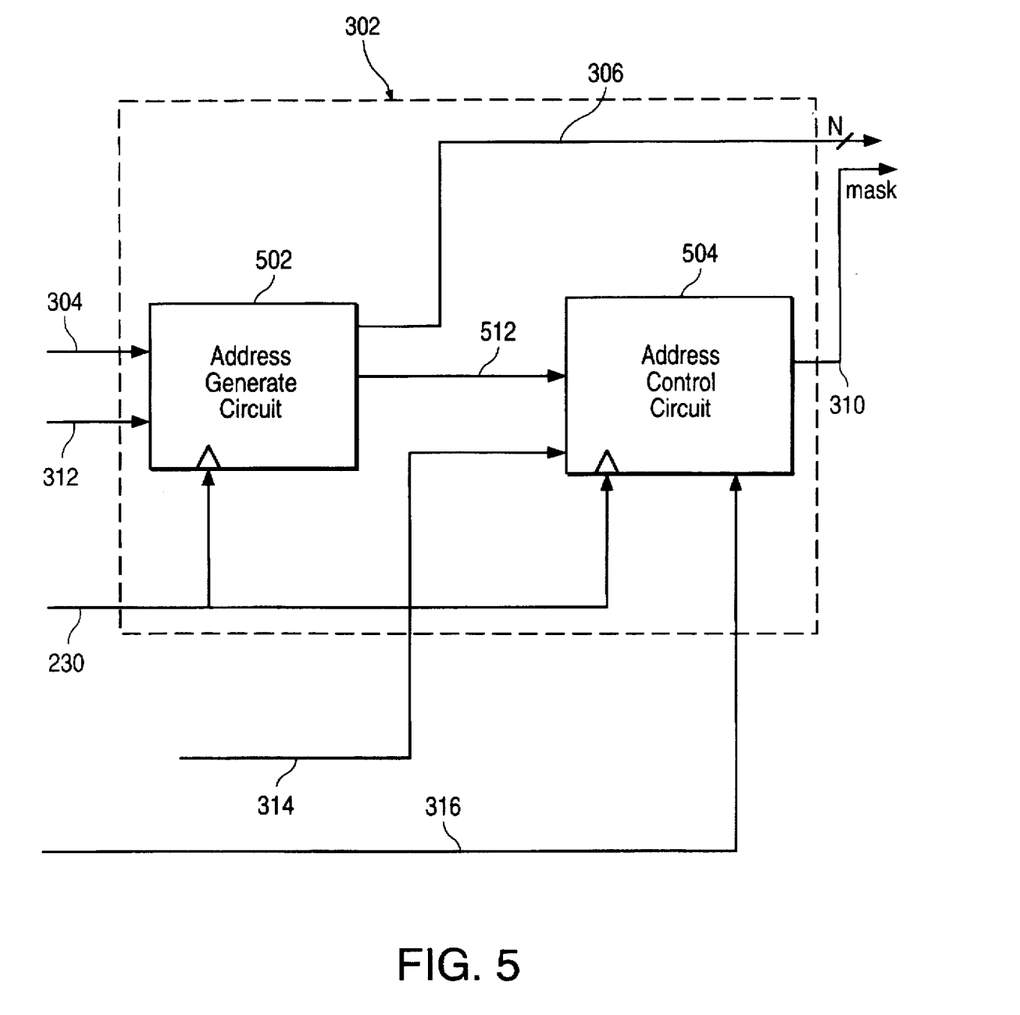
FIG. 5 is a block diagram illustrating in further detail the selection logic circuit.

FIG. 5 is a block diagram illustrating in further detail selection logic circuit 302. In one embodiment, logic circuit 302 includes an address generation circuit 502, and an address control circuit 504 coupled to address generate circuit 502. Address generate circuit 502 determines the offset of a logical frame of data and provides an address corresponding to this offset over address line 306. Address generate circuit 502 is coupled to receive 2N data bits from storage element 300 over data input line 312, N-bit preamble pattern over preamble input line 304, and a clock signal over clock input line 230. Generally, the N-bit preamble pattern is reserved for logical framing purposes only and produces an error if transmitted as data. Address generate circuit 502 compares the N-bit preamble bit pattern with one or more groups of N data bits located at various offsets within the 2N data bits. Each group of N-data bits is generated by selecting N data bits at a different offset within the 2N data bits. When a group of N-bits at a given offset within the 2N data bits matches the N-bit preamble bit pattern, address generation circuit 502 sets a valid bit line 512 to a value which indicates that an offset has been found. Address generate circuit 502 also generates an address over an address line 306 corresponding to the offset where the preamble bit pattern was found. In response to receiving the address over address line 306, selector circuit 308 generates a logical data frame over output port 118.

Figure 6:
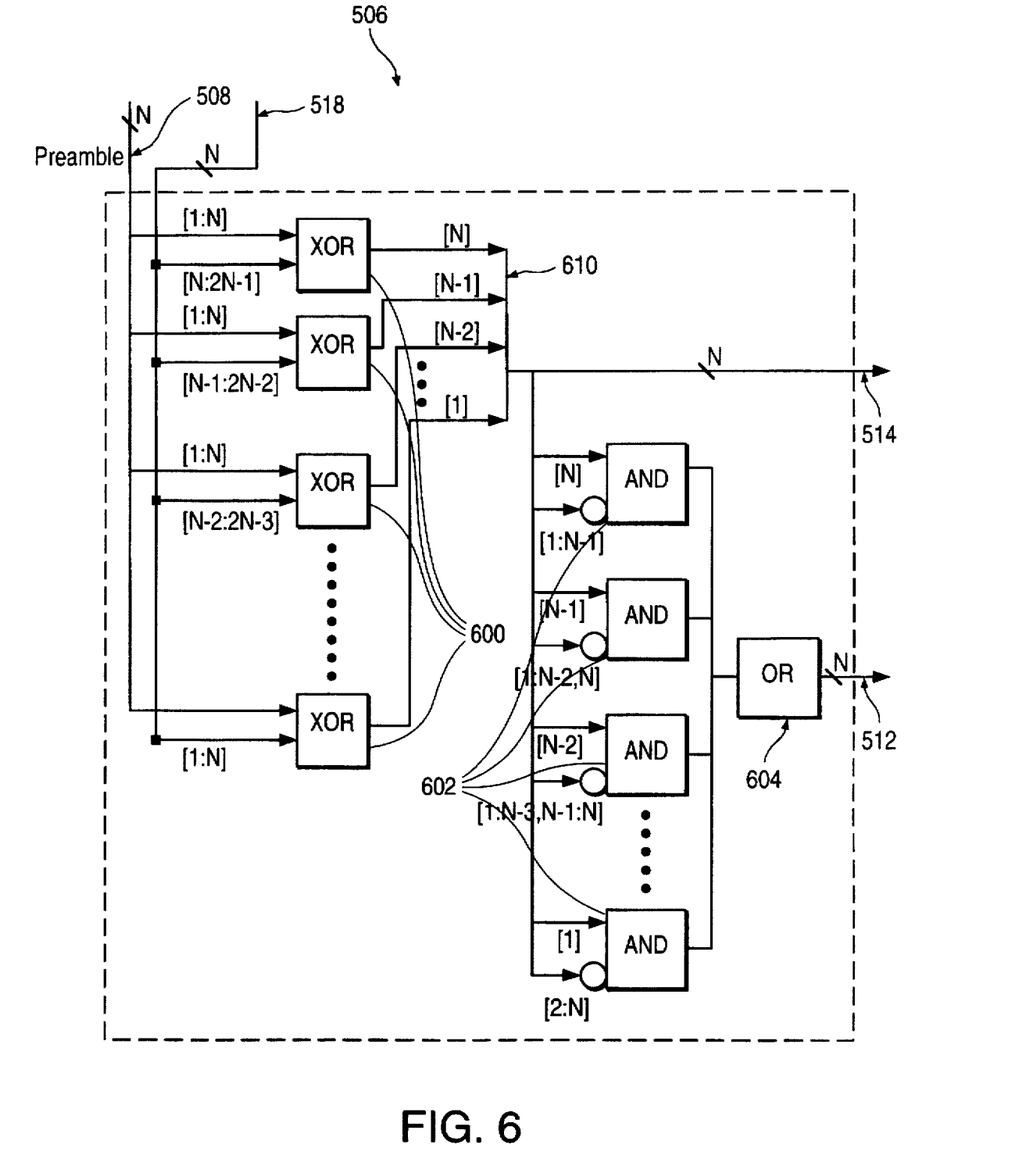
FIG. 6 is a block diagram illustrating the discrete logical elements used to construct the address generate circuit.

FIG. 6 is a block diagram illustrating various discrete logical elements used to construct address generate circuit 502. The input lines to each discrete element in FIG. 6 are indicated by placing brackets around the input lines or range of input lines. This nomenclature is used for all figures herein. For example, an input line to a discrete logical element having the notation [N, N−7:N−5] indicates that the particular discrete logical element receives input line N and the inclusive range of input lines beginning at line N−7 and ending at line N−5.

In one embodiment, address generate circuit 502 includes a series of N exclusive-or (XOR) gates 600, a series of N AND gates 602 coupled to the outputs of XOR gates 600 and an OR gate 604 coupled to receive the output of each AND gate 602. Each XOR gate 600 is coupled to receive an N-bit wide preamble bit pattern over preamble input line 304 and a unique N-bit wide data sample selected from the 2N bits transmitted over data input line 312. In one embodiment, each XOR gate 600 receives an N-bit wide data sample generated at a different offset within the 2N bits. An XOR gate 600 generates a TRUE value when the preamble bit pattern received over preamble input line 304 matches the selected N-bits received over data input line 312. Conversely, a FALSE value is generated by each XOR gate 600 where the two aforementioned input values do not match. The output of XOR gates 600 is provided to address line 306 which indicates the offset of the preamble.

The series of N AND gates 602 is coupled to receive N-wide address line 306 and determine whether a valid preamble bit pattern has been detected by an XOR gate 600 described above. Each AND gate 602 has one non-inverted input and N−1 inverted input ports. The non-inverted input is coupled to one line from N-wide address line 306 while the each inverted input port is coupled to one of the other N−1 input lines from address line 306. Each non-inverted input of AND gates 602 receives an input line from address line 306 to determine if a preamble bit pattern has been received by the corresponding XOR gate 600. A valid preamble is determined when a one AND gate receives a non-inverted input which is a logical TRUE value and a balance of inverted input lines which are a logical FALSE value. The output from AND gates 602 is provided as input to N-bit wide OR gate 604. If a preamble bit pattern is detected by XOR gates 600 and AND gates 602 then the valid bit line 512 provides a logical TRUE value. Conversely, if no preamble has been detected then valid bit line 512 provides a logical FALSE value. Valid bit line 512 is used, in particular, by address control circuit 504 and is described in more detail below.

Figure 7:
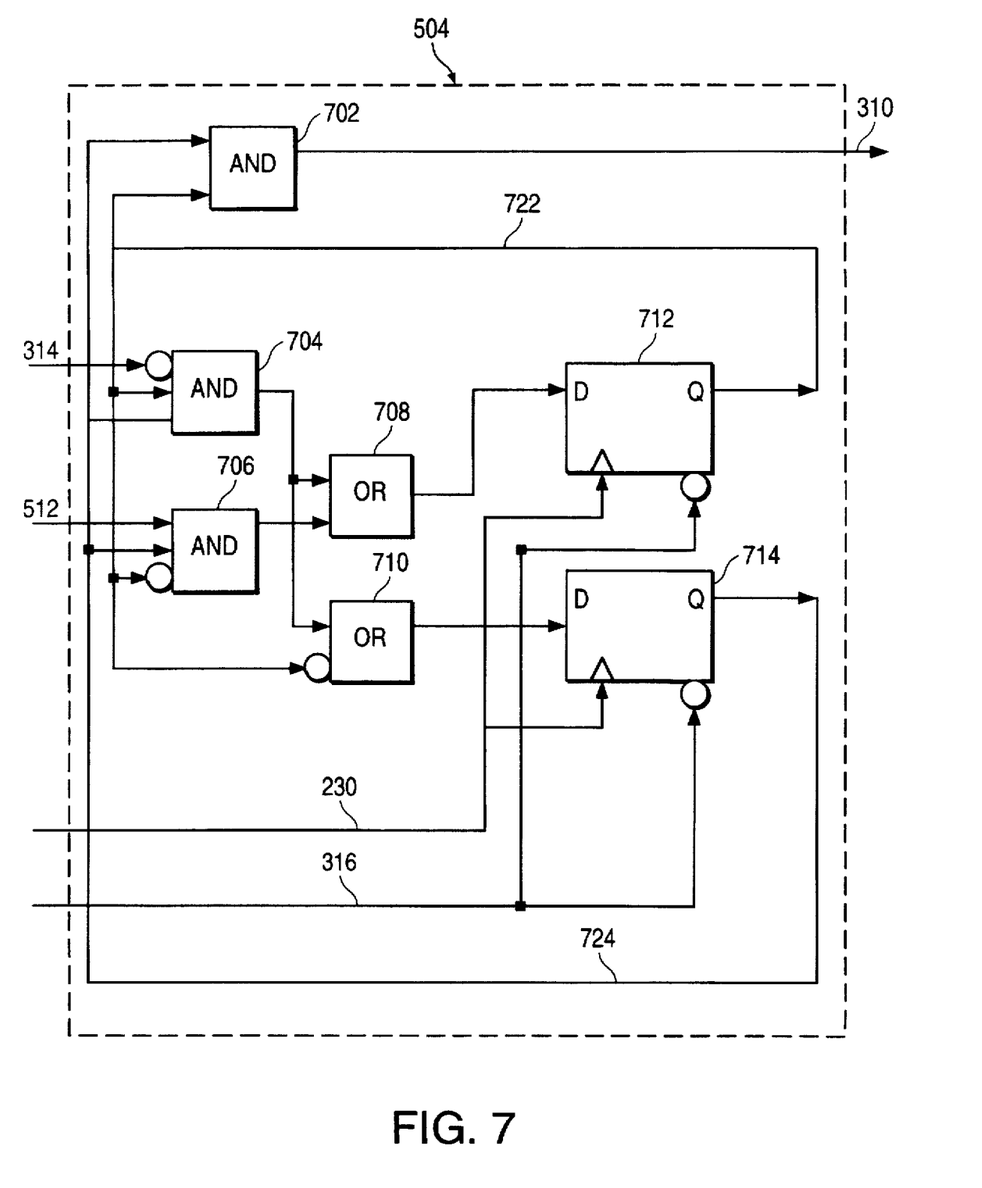
FIG. 7 is a block diagram illustrating discrete logical elements used to construct the address control circuit.

FIG. 7 is a block diagram illustrating discrete logical elements used to construct one embodiment of address control circuit 504. Address control circuit 504 controls what bit values are placed on mask output line 310. As described in more detail below, mask output line 310 is used by selector circuit 308 to gate output port 118 "on" when the invention is generating logically framed parallel data and "off" when logically framed parallel data is not being generated. In one embodiment, address control circuit 504 includes a first AND gate 702, a second AND gate 704, a third AND gate 706, a first OR gate 708, a second OR gate 710, a first D flip-flop 712 and a second D flip flop 714. Second AND gate 704 has an inverted input coupled to receive a resync signal over resync input line 314, a second input coupled to receive the output from first D flip-flop 712, and a third input coupled to receive the output from second D flip-flop 714. Third AND gate 706 has a first input coupled to receive data from valid bit input line 512, a second input coupled to receive the output from second D flip-flop 714, and an inverted input coupled to receive the output from first D flip-flop 712. First OR gate 708 is coupled to receive the output from second AND gate 704 and third AND gate 706. Second OR gate 710 has a first input coupled to receive the output from second AND gate 706 and an inverted input coupled to receive the output from first D flip-flop 712. First D flip-flop 712 is coupled to receive input from first OR gate 708 upon receipt of a clock signal from clock line 230. In addition, first D flip-flop 712 is coupled to reset line 316 for receiving a reset signal capable of resetting D flip flop 712 to an initial value. Second D flip-flop 714 is coupled to receive input from second OR gate 710 upon receipt of a clock signal 720. Second D flip-flop 714 is also coupled to reset line 316 for receiving a reset signal capable of resetting second D flip flop 712 to an initial value. Typically, the initial value stored in each D flip-flop upon receipt of the reset signal is 0.

In operation, the various discrete logic elements within address control circuit 504 are configured to work in three different modes: a reset mode; a sample mode; and an operate mode. Each mode corresponds to a unique combination of bit values stored in first D flip-flop 712 and second D flip-flop 714. In one embodiment, the reset mode is indicated when first D flip-flop 712 and second D flip-flop 714 each hold a "0" value. The sample mode is indicated when first D flip-flop 712 holds a "0" value and second D flip-flop 714 holds a "1" value. The operate mode is indicated when first D flip-flop 712 holds a "1" value and second D flip-flop 714 holds a "1" value.

Referring again to FIG. 7, the reset mode can be entered at anytime by generating a reset signal over reset signal line 718. The reset signal received by first D flip-flop 712 and second D flip-flop 714 causes a 0 value to be output over first flip-flop output line 722 and second flip-flop output line 724. The reset mode causes mask output line 310 to carry a signal indicating that selector circuit 118 should gate "off" output port 118 while the system resets. Typically a 0 value is carried by the signal over mask output line 310 upon a reset.

Address control circuit 504 enters a sample mode upon receipt of the next clock signal. The clock signal causes first D flip-flop 712 to output a 0 value over first flip-flop output line 722 and second D flip-flop 714 to output a 1 value over second output line 724. During the sample mode, address generate circuit 506 samples input data and determines where the preamble is located within a physical frame of parallel data. If the preamble is not found, valid bit input line 512 is set to a 0 or logical FALSE value and circuit 504 remains in the sample mode. Since there has been no change on the valid hit line 512. However, if address generate circuit 506 locates a preamble and the valid bit line 512 is set to a 1 or logical TRUE value. At this point, third AND gate 706 receives the valid bit signal and provides a 1 or logical TRUE to first OR gate 708 and the input to first D flip-flop 712 receives a 1 or logical TRUE value.

Upon receipt of the next clock signal address control circuit 504 enters an operate mode if the preamble has been located during the previous sample mode. Both first D flip-flop 712 and second D flip-flop 714 generate a 1 value over first flip-flop output line 722 and second flip-flop output line 724 respectively. The operate mode causes mask output line 716 to carry a signal indicating that output port 118 should be gated "on" because the circuit of the invention has located the offset of a logical frame of data. Typically a 1 value is carried by the signal over mask output line 310 when address control circuit 504 is in operate mode. In one embodiment, address control circuit 504 remains in the operate mode until a reset or resync signal is provided over reset line 316 or resync line 726 respectively.

Figure 8:
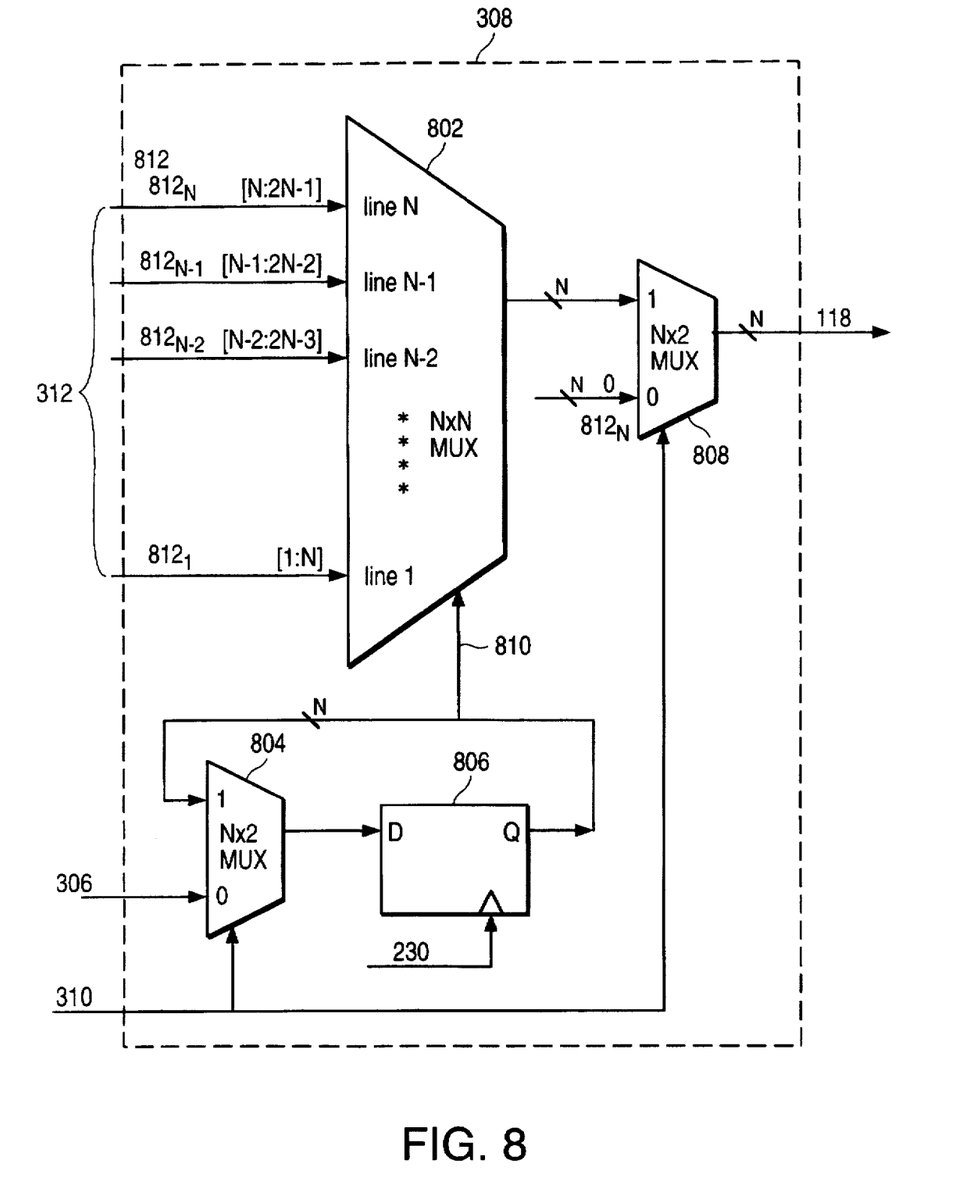
FIG. 8 is a block diagram illustrating the selector circuit in further detail.

FIG. 8 is a block diagram illustrating selector circuit 308 in further detail. Selector circuit 308 receives 2N data bits from storage element 300 and provides a logical frame of N bits parallel data over output port 118. Selector circuit 308 includes a first N×2 MUX 804, a third flip-flop 806, an N×N MUX 802 and a second N×2 MUX 808. First N×2 MUX 804 has two N-bit inputs and a selector input which is coupled to mask line 310. The first N-bit input is coupled to receive an N-bit address from address line 306 while the second N-bit input line is coupled to receive the N-bit output from third D flip-flop 806. Third D flip-flop 806 is coupled to receive the N-bit output from first N×2 MUX 804 upon the receipt of a clock signal over clock line 230.

Together, first N×2 MUX 804 and D flip-flop 806 form a sample and hold circuit. If the value on mask line 310 is a 1 then the N-bit output received over address line 310 is held in the "loop" formed between first N×2 MUX 804 and third flip-flop 806. However, if the value on mask line 310 is a 0 then no "loop" is formed between first N×2 MUX 804 and third D flip-flop 806 and the N-bit output received over address line 306 is not held.

N×N MUX 802 has a selector input 810 coupled to receive the N-bit output from third D flip-flop 806. N×N MUX 802 also has MUX input lines $812_1$–$812_N$, each coupled to receive a different N-bit wide set of parallel data. In one embodiment, each input line $812_1$–$812_N$ receives an N-bit set of data from data input line 312 as indicated in FIG. 8. Selector input 810 selects which of the input lines $812_1$–$812_N$ contains a logical frame of data.

Second N×2 MUX 808 is coupled to receive an N-bit output from N×N MUX 802 and a predetermined default parallel word. This portion of selector circuit 308 gates the output port "on" and "off". In one embodiment, if mask line 310 contains a 0 value, output port 118 contains the default N-bit parallel word having all 0s in each binary digit. Conversely, if mask line 310 contains a 1 value, output port 118 contains an N-bit logical frame of data provided by N×N MUX 802. It should be noted that mask line 310 is set to a 1 value when the preamble has been found and the offset of a logical frame within each set of 2N data bits has been determined. If no preamble has been detected, mask line 310 is set to 0.

Figure 9:
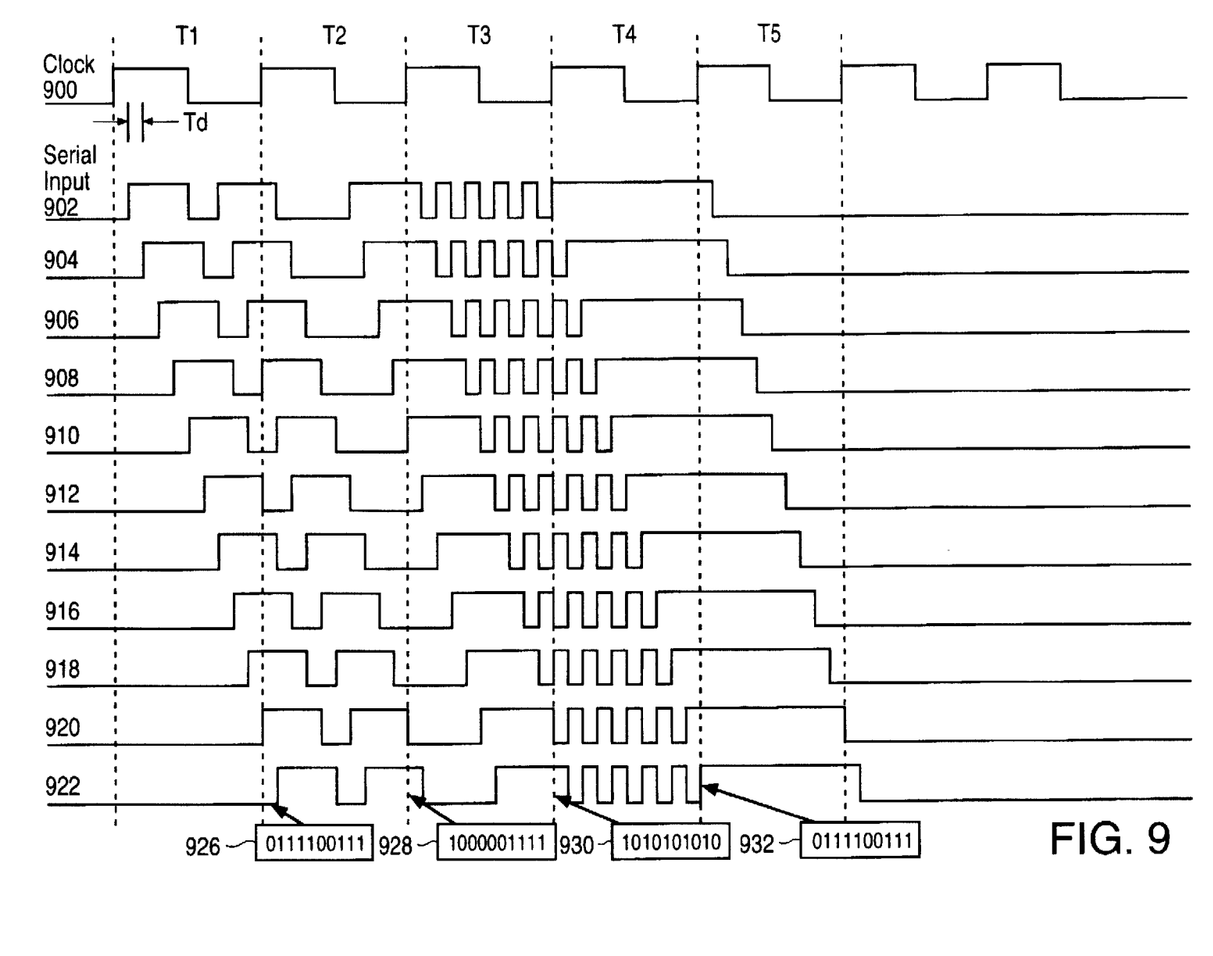
FIG. 9 is a timing diagram which illustrates the conversion of a serial data stream into a physical frame of data.

The operation of one embodiment of the invention is further illustrated with reference to FIGS. 9 and FIG. 10. FIG. 9 is a timing diagram which illustrates the conversion of a serial data stream into physical frames of data. In FIG. 9, assume that PLL 208 has "locked" onto the incoming serial bit signal in the manner described in detail above. Waveform 900 illustrates the clock signal generated over clock line 230 by PLL 208 (see FIG. 2). Each time interval T1–T5 in FIG. 9 corresponds to one clock period of the clock signal. The clock period shown in waveform 900 can be further divided into N time units each having delay Td. Note that time Td corresponds to the bit period of an incoming serial bit. Moreover, delay interval Td also corresponds to the bit period of each delay element $206_1$–$206_N$ contained within first data delay line 204 (see FIG. 2). This enables each delay element $206_1$–$206_N$ to store one data bit as it is transmitted into first data delay line 204.

A serial data signal is shown with waveform 902 (see FIG. 9). In one embodiment, first data delay line 204 contains 10 delay elements. These delay elements are coupled together and cascade data from one delay element to the next. First delay element $206_1$ receives the waveform 902 and generates a waveform 904 after delay Td. Similarly, second delay element $206_2$ receives waveform 904 and generates waveform 906 after an additional delay Td. This process is repeated by each of the remaining delay elements to generate each subsequent waveform 908–922. After 10 delays Td, each delay element in first data delay line 204 contains one bit of the parallel word. Thus, the parallel word transmitted over the serial input, illustrated by waveform 902, during time interval T1 can be determined by reading the signal values on waveforms 902–922 at the end of time interval T1. Accordingly, the first parallel word 926 is generated at the end of time interval T1. The second parallel word 928, third parallel word 930 and fourth parallel word 932 are generated at the end of time intervals T2–T4 respectively. Note that waveform 902 provides the most significant bit while waveform 922 contains the least significant bit of the parallel word.

There are a number of features to note about the invention at this point. First, larger parallel words can be accommodated by proportionally increasing the number of delay elements used by the invention. In the exemplary embodiment discussed above, first data delay line 204 receiving waveform 902 contains 10 elements. However, larger parallel words can be processed by increasing the number of delay elements. Second, the clock signal illustrated in waveform 900 operates at a fraction of the frequency of the incoming serial data. Circuits operating at lower clock speeds are advantageous because they are easier to fabricate and are less likely to introduce undesirable parasitic effects.

The discussion in reference to FIG. 9 above, illustrates the generation of a physical frame of data. However, most computers use a logical frame of data. Unfortunately, the logical frame of data, which includes bytes or words, may be split across one or more physical frames of data. As discussed above, framing circuitry 116 is used to generate a logical frame of data. FIG. 10 shows timing diagrams which illustrate the operation of framing circuit 116 and the generation of a logical frame of data.

Figure 10:
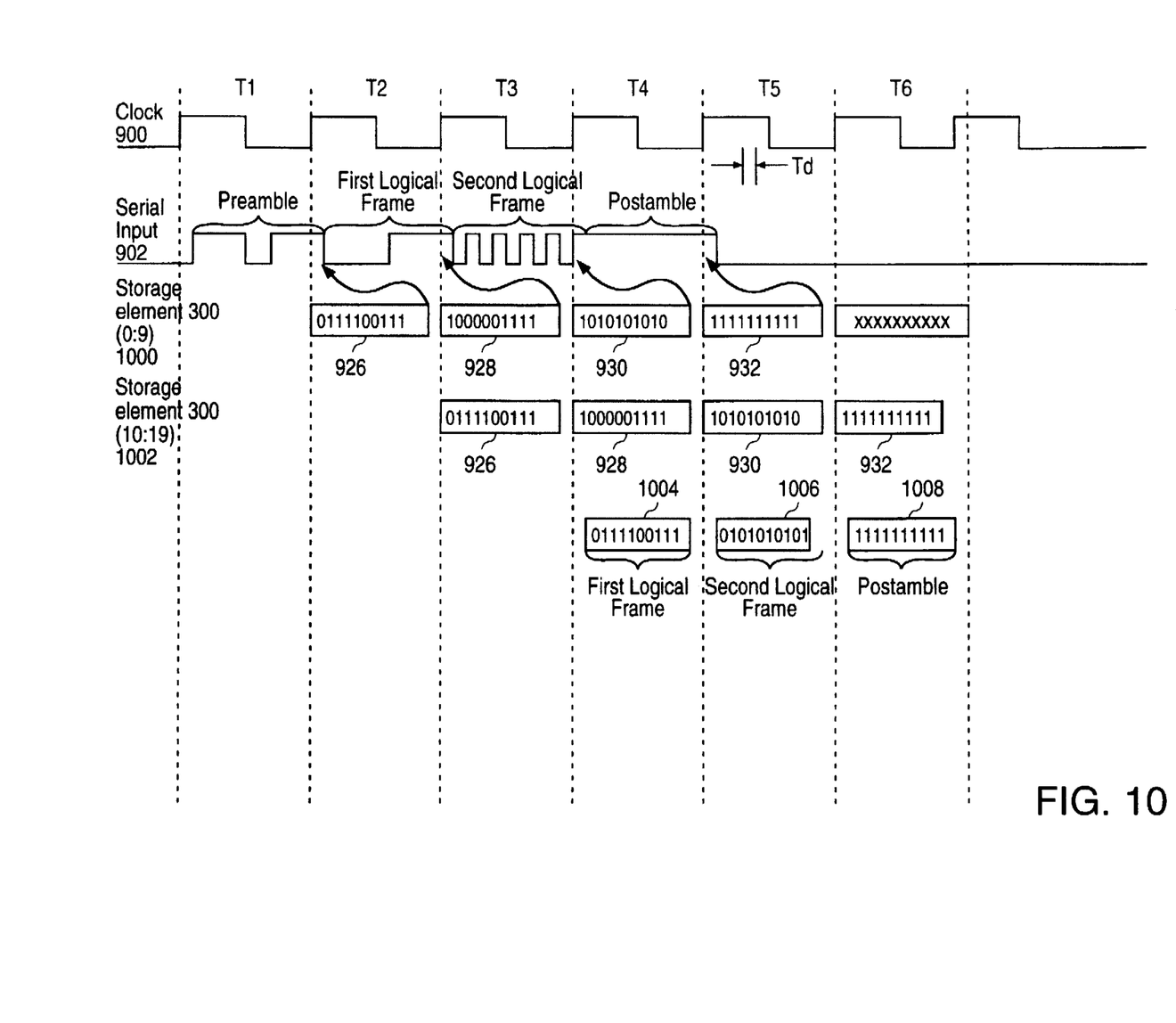
FIG. 10 is a timing diagram which illustrates the operation of the framing circuitry and the generation of a logical frame of data.

Referring to FIG. 10, the clock signal illustrated in waveform 900 and the serial input signal illustrated in waveform 902 are provided to illustrate the generation of a logical frame of data. Line 1000 shows the parallel words stored in the lower portion of the storage element 300 (e.g. bits 1 through 10) over time interval T1–T6. Line 1002 shows the parallel words stored in the upper portion of storage element 300 during time interval T1–T6 (e.g. bits 11 through 20).

Each clock signal generated over clock line 230 causes storage element 300 (see FIG. 3) to latch an additional N-bits of parallel data from first data delay line 204. Storage element 300 latches first parallel word 926 (FIG. 10) upon receipt of the clock signal during time interval T2. In one embodiment, the 10 bits in first parallel word 926 are stored in the bits 1 through 10 (1:10) within storage element 300. At time interval T3, the bits stored in bits 1:10 of storage element 300 are shifted into bits through nineteen (11:20) of the same storage element 300. During the same time interval T3, second parallel word 928 is stored in bits 1:10 of storage element 300. This process is repeated each subsequent time period keeping storage element 300 loaded with two physical frames of data or 20 parallel data bits.

The parallel data in storage element 300 is provided to selection logic circuit 302. Selection logic circuit 302 determines the offset location of a logical frame of data based upon the reserved preamble bit pattern. The reserved preamble bit pattern in this example is "1111001111". At time interval T3, the preamble bit pattern is at a 1 bit offset within storage element 300. The selection logic circuit 302 provides an address signal to selector circuit 308 indicative of this 1 bit offset. Consequently, selector circuit 308 selects an 10 bit logical frame of data from storage element 300 at an appropriate offset. In this example, a logical frame of data can be found within storage element 300 at bit positions (12:20) and bit (1). Accordingly, the first logical frame of parallel data 1004 is generated at time interval T4. The second logical frame of parallel data 1006 is generated at the next time interval T5. Subsequent logical frames of parallel data will be generated in a similar manner until a postamble frame of data 1008 is received or the system is reset. In one embodiment, the reserved postamble frame is "1111111111". Postamble frame 1008 is a reserved bit pattern which causes the framing circuit to stop transmitting logical frames of parallel data when it is transmitted over output line 118. Thus, framing circuit 116 resets after postamble frame 1008 is transmitted at time interval T6. Typically, this causes output line 118 to provide a default parallel output containing 0 bit values.

The circuitry and method of the present invention is particularly advantageous because it operates using a low-speed clock signal. Conventional serial-to-parallel converters, such as described in the Jeong reference, require multiple high speed clocks because each bit of data is clocked individually. However, the present invention clocks data in at byte-frequencies. Also, in typical serial-to-parallel converter systems, each bit receives a separate clock line operating at the data transmission frequency. However, the present invention uses a low-speed clock to latch each data byte, not each data bit, into data storage unit. The lower clock speed used by the present invention reduces the amount of interference and noise injected into the circuitry. Further, traditional systems typically require more clock lines at a higher frequency to handle larger data words being converted at higher rates. However, the clock frequency used with the present invention is inversely proportional to the word size transmitted. Therefore, larger data word systems may perform serial to parallel conversions with less interference and less noise using a lower clock speed.

The matching circuit design of the data delay line and the VCO is another novel feature of the present invention. By matching the design of these subsystems, the timing and control the present invention is greatly improved. Bit errors are minimized because the VCO precisely tracks the incoming data signal and latches data into the data storage unit from the first data delay line only after sufficient settling time has elapsed. Also, both the delay line and the VCO are controlled with a single control line rather than multiple individual control lines. Using a single control line and minimizing the logic circuitry saves semiconductor layout space and reduces overall power consumption.

The invention is also advantageous because it reduces metastability without significant additional costs. As discussed above, metastability occurs in digital logic circuitry when signal levels are sampled before the minimum hold times or the minimum signal thresholds required for digital logic are reached. It is especially difficult to detect and handle metastable conditions when they occur in digital circuitry because logic circuits may produce erroneous or misleading results. Some converters attempt to reduce metastability with oversampling and frequency estimation techniques and as a result have highly complex circuitry and increased power consumption. (For more information on a serial to parallel converter which use such oversampling and frequency estimation techniques see the Jeong reference). The present invention reduces metastability by delaying an additional fixed period of time before the data storage unit latches information from the data delay line. This effectively eliminates metastability problems by inserting proper setup and hold times into the process before the data is latched.

While the present invention has been described in relation to the specific embodiments described in the accompanying specification, other alternatives, embodiments and modifications will be apparent to those skilled in the art. It is intended that the specification is only exemplary, and the true scope and spirit of the invention is indicated by the following claims.

What is claimed is:

1. A method for receiving data comprising the steps of:
   receiving serial data elements;
   measuring the rate at which said serial data elements are received;
   storing said received serial data elements in a first delay line;
   controlling the rate at which said received serial data elements are stored in said first data delay line in accordance with the measured rate which said serial data elements are received; and
   storing n of said serial data elements received from said first data delay line in a storage element.

2. The method of claim 1 further comprising the steps of:
   storing 2n or more of said serial data elements received from said first delay line in said storage element; and
   selecting a logical frame of n serial data elements from said storage element.

3. The method of claim 2, wherein the step of storing the 2n serial data elements in said storage element further comprises the step of shifting n serial data elements into said second storage element upon receipt of a latch signal.

4. The method of claim 3, further comprising the steps of;
   determining when n serial data elements have been received by said first data delay line; and
   generating the latch signal when it is determined that the nth serial data element has been received in said first data delay line.

5. The method of claim 4, wherein determining when serial data elements have been received further comprises the steps of:
   providing a second data delay line having n/2 delay elements coupled together as a ring oscillator unit; and
   generating a clock signal edge each time a signal cascades to a subsequent delay element within said second data delay line.

6. The method of claim 2, wherein the step of selecting a logical frame further comprises the step of defining an offset which marks the beginning of a logical frame.

7. The method of claim 6 wherein the step of defining the offset further comprises the steps of:
   receiving a bit-pattern from said storage element;
   shifting the bit-pattern through a predetermined number of offsets;
   comparing each shifted bit pattern with a predetermined bit pattern; and
   selecting the offset in which the comparison indicates a match between said shifted bit pattern and said predetermined bit pattern.

8. The method of claim 6 wherein the step of defining the offset further comprises the steps of:
   receiving a bit-pattern from said storage element;
   comparing the bit-pattern with a plurality of predetermined bit patterns each shifted by an offset; and
   selecting the offset in which the comparison indicates a match between the bit pattern and said shifted predetermined bit-pattern.

9. The method of claim 1 wherein the step of controlling further comprises the steps of:
   measuring the signal characteristics of said received serial data elements;
   generating a reference signal using a second data delay line;
   comparing the signal characteristics of said serial data signal with said reference signal;
   generating a control signal having a magnitude indicative of the relative difference between said serial data signal and said reference signal; and
   adjusting the delay interval of each data delay element within said first and second data delay line in accordance with the control signal.

10. The method of claim 9 wherein adjusting the delay interval in each delay element causes said second data delay line to substantially lock onto the serial data signal transmitted and causes said first data delay line to store serial data substantially upon arrival.

11. A circuit for converting an N bit of serial data string transmitted over a data transmission medium into a parallel data, comprising:
    a buffer, coupled to the data transmission medium, for providing data signals;
    a phase lock loop (PLL), coupled to said buffer, for generating a delay line control signal (Vcontrol) in response to the receipt of the data signals; and
    a first data delay line, coupled to said buffer and coupled to receive said Vcontrol signal, wherein cascading the serial data through said first delay line generates n bit parallel data.

12. The circuit of claim 11 wherein the buffer is configured to provide differential data signals.

13. The circuit of claim 11 wherein the first data delay line includes N data delay elements coupled together in a daisy chain.

14. The circuit of claim 11, wherein the phase lock loop (PLL) further comprises:
    a phase detector circuit, coupled to receive a data signal from the buffer circuit and a reference signal from a second data delay line, configured to generate a control signal having a magnitude corresponding to the signal characteristic differences of the data signal and the reference signal; and
    a charge pump circuit, coupled to the phase detector circuit, configured to produce said delay line control signal (Vcontrol) in response to the magnitude of the control signal wherein said second data delay line is coupled to receive a delay control signal (Vcontrol), and said delay line control signal (Vcontrol) causes the rate of said second data delay line to lock onto the rate which the serial data is received in the buffer.

15. The circuit of claim 14, wherein the second data delay line has n/2 delay elements configured as a ring oscillator.

16. The circuit of claim 14, wherein a low pass filter input is coupled to said charge pump circuit and said low pass filter output is coupled to both the first and the second data delay line.

17. The circuit of claim 12, wherein the delay line control signal (Vcontrol) biases each delay element in the second delay line to generate, a shorter delay interval when the signal characteristics indicate the reference signal is slower than the serial data signal, and a longer delay interval when the signal characteristics indicate the reference signal is faster than the serial data signal.

18. The circuit of claim 16, wherein the signal characteristic is phase.

19. The circuit of claim 16, wherein the signal characteristic is frequency.

20. The circuit of claim 16, wherein the signal characteristic is periodicity.

21. The circuit of claim 16, wherein the signal characteristic is amplitude.

22. The circuit of claim 12 further comprising a framing circuit capable of generating a logical frame of data, said framing circuit comprising:

a clock circuit capable of generating a latch signal when N parallel data elements have been received in said first data delay line;

a storage circuit, coupled to receive parallel data stored in said first data delay line and coupled to the clock circuit, configured to store more data elements than are contained in a logical frame of data elements upon receipt of the latch signal;

a compare circuit, coupled to said storage circuit, configured to compare said parallel data with a plurality of predetermined bit patterns and indicate a pattern match; and a selector circuit, coupled to said compare circuit and said storage circuit and said clock circuit, configured to select a logical frame of data elements from said storage element based upon the pattern match indicated in said compare circuit and upon receipt of the latch signal.

23. The circuit of claim 22 wherein the plurality of predetermined bit patterns are generated by shifting a first predetermined bit pattern by one or more offsets.

24. The circuit of claim 22, wherein the clock circuit further comprises of said PLL having a frequency substantially equal to the frequency which N bits are transmitted to the buffer.

25. The circuit of claim 22, wherein the clock circuit further comprises of a signal source having a frequency substantially equal to the data transmission rate of N bits.

* * * * *